(12) United States Patent
Song

(10) Patent No.: US 9,362,457 B2
(45) Date of Patent: Jun. 7, 2016

(54) LIGHT EMITTING DEVICE, LIGHT EMITTING DEVICE PACKAGE AND LIGHTING SYSTEM INCLUDING THE SAME

(75) Inventor: Hyun-Don Song, Incheon (KR)

(73) Assignee: LG INNOTEK CO., LTD., Seoul (KR)

( * ) Notice: Subject to any disclaimer, the term of this patent is extended or adjusted under 35 U.S.C. 154(b) by 490 days.

(21) Appl. No.: 12/729,472

(22) Filed: Mar. 23, 2010

(65) Prior Publication Data

US 2010/0244084 A1 Sep. 30, 2010

(30) Foreign Application Priority Data

Mar. 24, 2009 (KR) ........................ 10-2009-0024835

(51) Int. Cl.
*H01L 33/40* (2010.01)
*H01L 33/14* (2010.01)
*H01L 33/04* (2010.01)

(52) U.S. Cl.
CPC ................ *H01L 33/40* (2013.01); *H01L 33/14* (2013.01); *H01L 33/405* (2013.01); *H01L 33/04* (2013.01); *H01L 2224/48091* (2013.01)

(58) Field of Classification Search
CPC ....... H01L 33/40; H01L 33/405; H01L 33/42; H01L 33/14
USPC ............................................ 257/99, E33.063
See application file for complete search history.

(56) References Cited

U.S. PATENT DOCUMENTS

| 6,268,618 | B1* | 7/2001 | Miki et al. ...................... 257/99 |
| 2003/0010994 | A1* | 1/2003 | Chen et al. ...................... 257/99 |
| 2005/0174801 | A1* | 8/2005 | Cao ................................ 362/575 |
| 2006/0033115 | A1* | 2/2006 | Blochwitz ............. H01L 51/002 257/94 |
| 2006/0234411 | A1 | 10/2006 | Ryu et al. ......................... 438/46 |
| 2007/0131956 | A1* | 6/2007 | Lin .................................. 257/98 |
| 2008/0224165 | A1 | 9/2008 | Seong et al. ..................... 257/99 |
| 2008/0230799 | A1* | 9/2008 | Wang .................... H01L 33/145 257/99 |
| 2008/0258170 | A1 | 10/2008 | Hsu ................................. 257/99 |
| 2008/0290364 | A1* | 11/2008 | Kamiya et al. .................. 257/99 |
| 2008/0303055 | A1* | 12/2008 | Seong ........................... 257/103 |

FOREIGN PATENT DOCUMENTS

| CN | 101027790 | 8/2007 |
| DE | 103 25 603 A1 | 1/2005 |
| JP | 03-82174 A | 4/1991 |
| JP | 11-168240 | 6/1999 |
| KR | 10-2006-0007948 A | 1/2006 |
| KR | 10-0855340 B1 | 9/2008 |
| WO | WO 2009/089198 A1 | 7/2009 |

OTHER PUBLICATIONS

European Search Report dated Nov. 22, 2010 issued in Application No. 10 15 7610.

(Continued)

*Primary Examiner* — Benjamin Sandvik
(74) *Attorney, Agent, or Firm* — Ked & Associates, LLP

(57) ABSTRACT

A light emitting device (LED), an LED package, and a lighting system including the LED package are provided. The light emitting device (LED) may include a light emitting structure, a carrier injection layer, and an electrode layer. The light emitting structure may include a first conductive semiconductor layer, an active layer, and a second conductive semiconductor layer. The carrier injection layer may be positioned over the light emitting structure, and the electrode layer may be positioned over the carrier injection layer.

22 Claims, 4 Drawing Sheets

(56) References Cited

OTHER PUBLICATIONS

Korean Office Action dated Dec. 10, 2010 issued in Application No. 10-2009-0024835.

Korean Office Action dated Sep. 11, 2012 for related application No. 9-5-2012-053573822.
Korean Notice of Allowance dated Jan. 16, 2013 issued in Application No. 10-2009-0024835.
Chinese Office Action dated Jun. 4, 2012.

* cited by examiner

LIGHT EMITTING DEVICE, LIGHT EMITTING DEVICE PACKAGE AND LIGHTING SYSTEM INCLUDING THE SAME

CROSS-REFERENCE TO RELATED APPLICATION

This application claims priority under 35 U.S.C. §119 to Korean Patent Application No. 10-2009-0024835, filed in Korea Mar. 24, 2009, which is hereby incorporated by reference in its entirety.

BACKGROUND

1. Field

This relates to a light emitting device, a light emitting device package, and a lighting system including the light emitting device package.

2. Background

Light emitting devices (LEDs) are semiconductor devices that convert electricity into light. Commercialized red LEDs and green LEDs have been used as light sources for electronic devices such as, for example, information and communication devices.

Nitride semiconductors have high thermal stability and wide band gap and may be used together with other elements such as indium (In) and aluminum (Al) for fabricating semiconductor layers capable of emitting green, blue, and white light, and emission wavelengths of nitride semiconductors may be relatively easily adjusted. In the field of nitride based LEDs, attempts to improve semiconductor growth structures or processes of growing epitaxial layers have been recently made to develop optical devices having high light extraction efficiency.

The efficiency of an LED chip may be determined by internal quantum efficiency, light extraction efficiency, and current injection efficiency. The current injection efficiency is relate to electric resistance and applied voltage, and thus a reduction in resistance of the LED chip may to increase the current injection efficiency.

BRIEF DESCRIPTION OF THE DRAWINGS

The embodiments will be described in detail with reference to the following drawings in which like reference numerals refer to like elements wherein.

DETAILED DESCRIPTION

Reference will now be made in detail to embodiments presented herein, examples of which are illustrated in the accompanying drawings.

In the following description, it will be understood that when a layer or film is referred to as being 'on' another layer or substrate, it may be directly on another layer or substrate, or intervening layers may also be present. Further, it will be understood that when a layer is referred to as being 'under' another layer, it may be directly under another layer, or one or more intervening layers may also be present. In addition, it will also be understood that when a layer is referred to as being 'between' two layers, it may be the only layer between the two layers, or one or more additional layers may also be present between the two layers.

Figure 1:
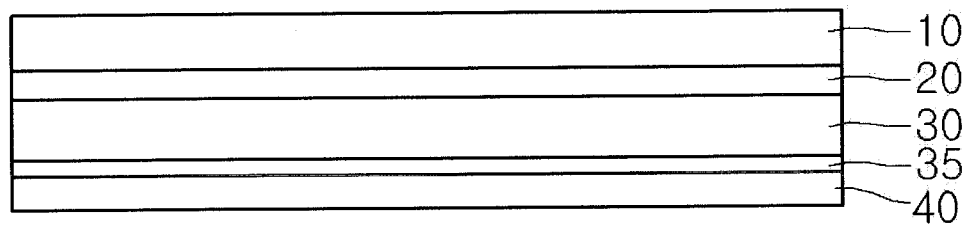
FIG. 1 is a sectional view of an exemplary a light emitting device LED according to an embodiment as broadly described herein.

The LED shown in FIG. 1 may include a light emitting structure including a first conductive semiconductor layer 10, an active layer 20, and a second conductive semiconductor layer 30. A carrier injection layer 35 may be disposed on the light emitting structure, and an electrode layer 40 may be disposed on the carrier injection layer 35.

As shown in FIG. 1, the carrier injection layer 35 may be disposed between the second conductive semiconductor layer 30 and the electrode layer 40. However, the carrier injection layer 35 is not limited to this arrangement. For example, in alternative embodiments, the carrier injection layer 35 may be disposed between the first conductive semiconductor layer 10 and another electrode (not shown in FIG. 1). Then, if the second conductive semiconductor layer 30 were, for example, an electron injection layer, the work function of an N-type ohmic layer may be lower than the work function of an N-type semiconductor layer. Furthermore, in the embodiment shown in FIG. 1, the second conductive semiconductor layer 30 may be a P-type semiconductor layer. However, in alternative embodiments, the second conductive semiconductor layer may be, for example, a N-type semiconductor layer.

The LED shown in FIG. 1 may increase carrier injection efficiency and current injection efficiency so as to improve efficiency of an LED chip, and may improve a method of manufacturing the LED.

Among various resistance components of an LED, the contact resistance between a p-type semiconductor layer and an electrode may be a dominant factor determining the current injection efficiency of a chip. Although a high doping level may be desirable in forming an ohmic electrode, due to the properties of a p-type semiconductor layer, p-type semiconductor layers cannot typically be doped to a high doping level, thereby generating a relatively large contact resistance.

Therefore, in the embodiment shown in FIG. 1, in consideration of a decrease in hole injection efficiency caused by such contact resistance, an additional hole injection layer may be disposed between a p-type semiconductor layer and an electrode to improve the hole injection efficiency and hole-electron recombination rate.

However, since the doping level of a general p-type semiconductor layer may be relatively low, if a metal is brought into contact with the semiconductor layer, a potential barrier may be formed at the contact surface, and thus ohmic contact is not formed. For this reason, if the work function of a metal is $\psi m$ and the work function of a semiconductor is $\psi s$, a potential barrier is not generated by satisfying $\psi m < \psi s$ for an n-type semiconductor layer and $\psi m > \psi s$ for a p-type semiconductor layer. Therefore, $\psi m > \psi s$ may be selected for a contact surface of a p-type semiconductor layer so as to control a potential barrier of carriers by improving hole injection efficiency.

In this embodiment, a hole injection layer having a critical thickness may be inserted between a p-type semiconductor layer and a second electrode layer, for example, ohmic layers, so as to improve hole injection efficiency and thus improve current injection efficiency. The increase in current injection efficiency caused by the insertion of the hole injection layer may produce improved electron-hole recombination efficiency in an active layer, and ultimately, the amount of light and quantum efficiency may be improved.

Figure 2A:
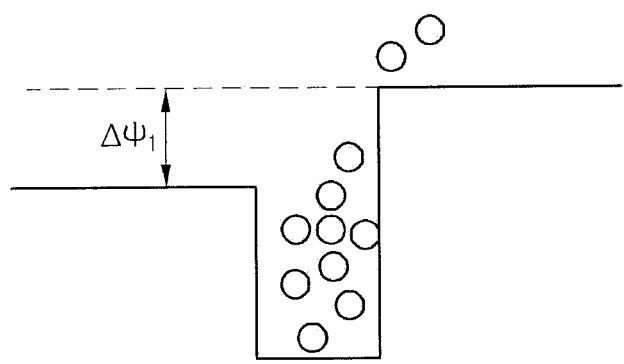
FIGS. 2A and 2B illustrate a work function of the exemplary LED shown in FIG. 1.
Figure 2B:
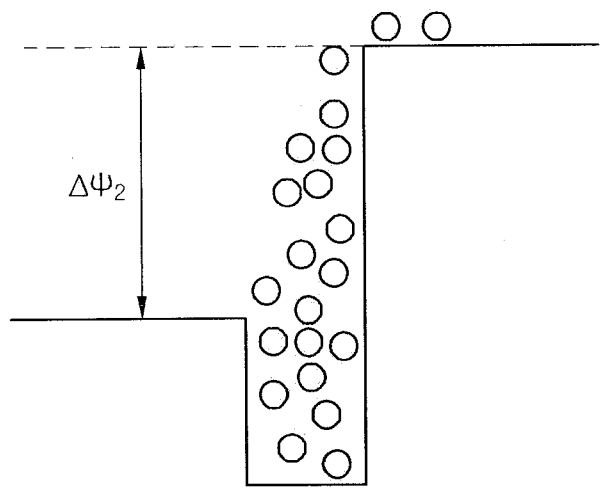

FIGS. 2A and 2B illustrate a variation of a work function of an LED.

In this embodiment, instead of a structure in which a p-type semiconductor layer and an ohmic layer are in direct contact, a hole injection layer may be disposed between a p-type semiconductor layer and a second electrode, for example, ohmic layers.

The increase in hole injection efficiency due to the insertion of the hole injection layer may be explained as follows. An ohmic contact of a p-type semiconductor layer is determined by the work function between the p-type layer and the ohmic layer rather than by the electrical conductivity of the ohmic layer. By selecting a proper material for the ohmic layer according to the above-described relationship of $\psi m > \psi s$, the work function difference between the p-type layer and the ohmic layer may be increased so as to increase injection efficiency of holes to an active layer. According to this embodiment, owing to the formation of a hole injection layer, the work function difference ($\Delta\Psi$) between the p-type semiconductor layer and the ohmic layer may be increased from $\Omega\Psi_1$ to $\Delta\Psi_2$.

In this embodiment, a hole injection layer is inserted between a p-type semiconductor layer and an ohmic layer, and due to a relatively high work function of the hole injection layer, the work function difference between the p-type semiconductor layer and the hole injection layer may be relatively large. As the work function difference increases, the potential barrier wall becomes higher, and hole injection amounts may increase to increase the hole injection efficiency when a current is applied. This is realized by increasing the work function of the hole injection layer, and the work function of the hole injection layer may be increased by increasing an oxygen concentration when the hole injection layer is formed.

Thus, the work function difference between a semiconductor layer and an electrode layer may be increased by inserting an additional hole injection layer, so as to increase hole injection efficiency, and thus current injection efficiency, thereby improving the emission efficiency of an LED chip.

Figure 3:
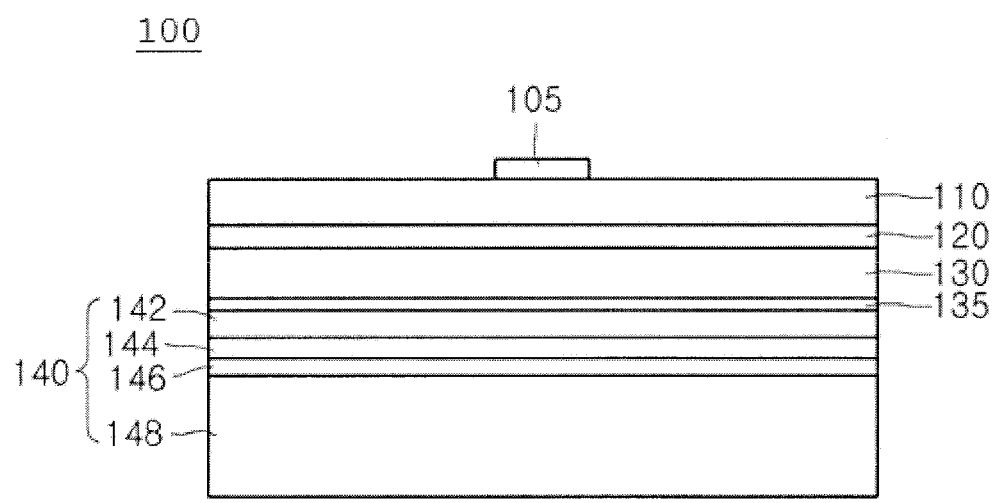
FIG. 3 is a sectional view of an LED according to another embodiment as broadly described herein.

FIG. 3 is a sectional view of an LED 100 in accordance with an embodiment as broadly described herein. Although a vertical type LED is shown in FIG. 3, other arrangements may also be appropriate. Hereinafter, a method of manufacturing an LED will be described with respect to the LED 100 shown in FIG. 3.

First, a light emitting structure including a first conductive semiconductor layer 110, an active layer 120, and a second conductive semiconductor layer 130 may be disposed on a first substrate. For purposes of discussion, the first substrate may be positioned on an upper side of the first conductive semiconductor layer 110 when viewed in FIG. 1.

The first substrate may be, for example, a sapphire ($Al_2O_3$) single crystal substrate, or other type of substrate as appropriate. Wet cleaning may be performed on the first substrate to remove impurities from the surface of the first substrate.

The first conductive semiconductor layer 110 may be formed on the first substrate by, for example, a chemical vapor deposition (CVD) method, a Molecular beam epitaxy (MBE) method, a sputtering method, a hydride vapor phase epitaxy (HVPE) method, or other method as appropriate. In addition, the first conductive semiconductor layer 110 may be formed by injecting trimethylgallium (TMGa) gas, ammonia ($NH_3$) gas, nitrogen ($N_2$) gas, and a silane ($SiN_4$) gas including an n-type impurity such a silicon (Si) into a chamber.

Next, the active layer 120 may be disposed on the first conductive semiconductor layer 110. At the active layer 120, electrons injected through the first conductive semiconductor layer 110 meet holes injected through the second conductive semiconductor layer 130, so that light having energy determined by the energy band of a material of the active layer (light emitting layer) 120 may be emitted by the active layer 120. The active layer 120 may have a quantum well structure formed by, for example, sequentially stacking nitride semiconductor thin layers having different energy bands one or more times. For example, the active layer 120 may have an InGaN/GaN quantum well structure formed by injecting trimethylgallium (TMGa) gas, ammonia ($NH_3$) gas, nitrogen ($N_2$) gas, and trimethylindium (TMIn) gas. Other arrangements may also be appropriate.

Thereafter, the second conductive semiconductor layer 130 may be disposed on the active layer 120. For example, the second conductive semiconductor layer 130 may be formed by injecting trimethylgallium (TMGa) gas, ammonia ($NH_3$) gas, nitrogen ($N_2$) gas, and bisethylcyclopentadienyl magnesium ($EtCp_2Mg$){$Mg(C_2H_5C_5H_4)_2$} including a p-type impurity such as, for example, magnesium (Mg) into a chamber. However, other materials and methods may be used in the formation of the second conductive semiconductor layer 130 as appropriate.

Next, a carrier injection layer 135 may be disposed on the second conductive semiconductor layer 130. In the embodiment shown in FIG. 3, the carrier injection layer 135 is disposed on the second conductive semiconductor layer 130. However, other arrangements may also be appropriate. In the embodiment show in FIG. 3, the carrier injection layer 135 is disposed between the second conductive semiconductor layer 130 and an electrode/electrode layer 140. The work function of the carrier injection layer 135 may be relatively high so that the work function difference between the second conductive semiconductor layer 130 and the carrier injection layer 135 may also be relatively high. As the work function difference is large, a potential barrier increases, and hole injection amounts may also increase so as to increase the hole injection efficiency when a current is applied. This is realized by increasing the work function of the carrier injection layer 135, by, for example, increasing an oxygen concentration when the carrier injection layer 135 is formed.

In the embodiment shown in FIG. 3, for p-type ohmic contact, when the work function of an ohmic layer is greater than the work function of the second conductive semiconductor layer 130, ohmic contact is possible.

In addition, the work function of the carrier injection layer 135 may be greater than the work function of the ohmic layer. For example, in the embodiment shown in FIG. 3, the carrier injection layer 135 may include a metal oxide having a work function of about 4.2 eV or greater. However, the carrier injection layer 135 is not limited thereto. For example, if the electrode/electrode layer 140 includes an ohmic layer 142 to provide p-type ohmic contact, such as an indium tin oxide (ITO) layer, the work function of the ohmic layer may be about 4.2 eV, the work function of the second conductive semiconductor layer 130 may be about 4.0 eV, and the carrier injection layer 135 may include a metal oxide having a work function of about 4.2 eV or greater.

The carrier injection layer 135 may be a carrier tunneling layer and may have a thickness that allows for tunneling. For example, the carrier injection layer 135 may have a thickness of about 1 nm to about 30 nm. Other thicknesses may also be appropriate. For example, in the case of a metal, the thickness of a metal-oxide structure formed by heat treatment may be about 50 nm or smaller. To increase the transmittance of the metal-oxide to 90% or higher, so as to not effect the emission intensity of a semiconductor, a large amount of oxygen may be injected. Due to this injection of oxygen, the thickness of a metal layer may be increased. Therefore, a desired thickness of a metal-oxide, which is formed by supplying sufficient oxygen to ensure sufficient transmittance, may be obtained when the thickness of a metal layer is 30 nm or smaller. That is, if a metal layer is formed to a thickness of about 30 nm or greater, although ozone treatment, such as heat treatment, may be performed, transmittance may decrease, and the emission intensity may be reduced. Therefore, although hole injection efficiency is high, the amount of light may not be increased.

The carrier injection layer 135 may include an oxide film including a transition metal. For example, a process of forming the carrier injection layer 135 may include a process of forming a metal layer and a process of irradiating ultraviolet (UV) light onto the metal layer under an oxygen atmosphere for ozone treatment. If the metal layer is exposed to UV light under an oxygen atmosphere, the surface of the metal layer is ozone-treated by the oxygen, and thus the oxygen concentration of the metal layer increases, thereby increasing a work function.

The metal layer may be a transition metal layer. However, the metal layer is not limited thereto, and other metals may also be appropriate for the metal layer. For example, the carrier injection layer 135 may include a transition metal oxide film including at least one of aluminum (Al), magnesium (Mg), cadmium (Cd), tin (Sn), lead (Pb), copper (Cu), silver (Ag), gold (Au), tungsten (W), rhenium (Re), cobalt (Co), chromium (Cr), nickel (Ni), ruthenium (Ru), rhodium (Rh), palladium (Pd), platinum (Pt), or germanium (Ge).

In alternative embodiments, a process of forming the carrier injection layer 135 may include a process of forming a metal layer, and heat-treating the metal layer under an oxygen atmosphere using a rapid thermal process (RTP). The metal layer may be a transition metal, but is not limited thereto, and other metals may also be appropriate. If a deposited metal layer is rapidly heat-treated under oxygen atmosphere, a metal-oxide having a high oxygen concentration may be obtained, and the work function of the metal-oxide may be relatively higher.

Such a rapid thermal process may be performed in different manners according to the types of metals involved. For example, if heat treatment is performed at 300° C. to 400° C. for one minute under an oxygen atmosphere, a metal oxide having an increased work function may be obtained. However, in the case of a vertical type LED, if the heat treatment is about 400° C. or higher, the reflection efficiency of a reflection layer may be decreased. In order to oxidize a metal into a metal-oxide, heat treatment may be performed at about 300° C. to 400° C.

The electrode/electrode layer 140 may be disposed on the carrier injection layer 135. The electrode/electrode layer 140 may include the ohmic layer 142, and may be formed by stacking metal or metal alloy layers in multiple stages so as to increase hole injection efficiency. The ohmic layer 142 may include at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, or Ni/IrOx/Au/ITO. However, the ohmic layer 142 is not limited thereto.

In addition, the electrode/electrode layer 140 may also include a reflective layer 144 and an adhesion layer 146. In certain embodiments, the reflective layer 144 may include a metal layer including Al, Ag, or an alloy of Al and Ag. Aluminum or silver effectively reflects light emitted by the active layer 120 so that the light extraction efficiency of the LED may be significantly improved. In certain embodiments, the reflective layer 144 may function as the adhesion layer 146, or the adhesion layer 146 may be separately formed of nickel (Ni) or gold (Au).

As shown in FIG. 3, the electrode/electrode layer 140 may also include a second substrate 148. If the first conductive semiconductor layer 110 is sufficiently thick, such as, for example, about 50 μm, the second substrate 148 may be omitted. The second substrate 148 may be formed of a highly conductive material such as, for example, a metal, a metal alloy, or a conductive semiconductor. For example, the second substrate 148 may be formed of a material such as copper (Cu), a Cu alloy, silicon (Si), molybdenum (Mo), or silicon germanium (SiGe). The second substrate 148 may be formed by an electrochemical metal deposition method, a bonding method using an eutectic metal bonding method, or other appropriate method.

Next, the first substrate (on which the first conductive semiconductor layer 110 was formed at the beginning of the process) is removed to expose the first conductive semiconductor layer 110. The first substrate may be removed by using a high power laser (laser lift-off) or a chemical etching method. In addition, the first substrate may be removed by a physical grinding method. The exposed first conductive semiconductor layer 110 may have a defective surface when the first substrate is removed. Such a defect may be removed by dry or wet etching. An electrode 105 may then be disposed on the first conductive semiconductor layer 110 as shown in FIG. 3.

In the LED shown in FIG. 3, the work function difference between the semiconductor layer and the electrode layer may be increased by inserting an additional carrier injection layer, so as to increase hole injection efficiency and current injection efficiency, thereby improving the overall efficiency of an LED chip.

Figure 4:
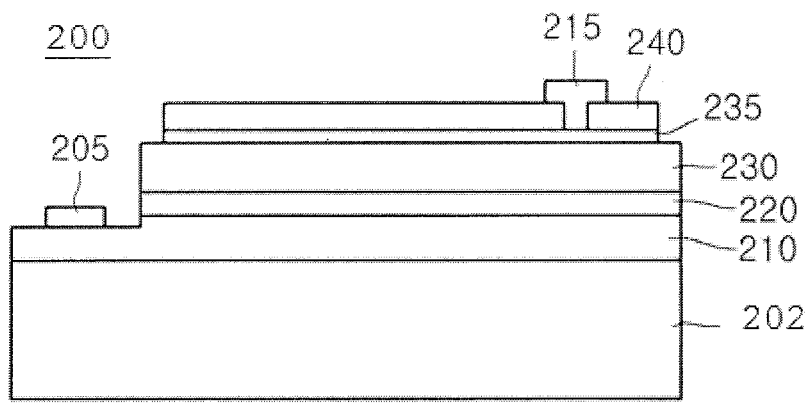
FIG. 4 is a sectional view of an LED according to another embodiment as broadly described herein.

FIG. 4 is a sectional view of an LED 200 according to embodiment as broadly described herein, in which a lateral type LED is exemplified. However, the embodiment is not limited thereto, and other arrangements of the components thereof may also be appropriate. Hereinafter, a method of manufacturing an LED with respect to the LED 200 shown in FIG. 4 will be described. This embodiment may include features similar to those discussed with respect to the embodiment shown in FIG. 3, and thus the following discussion will focus mainly on the differences.

First, a light emitting structure including a first conductive semiconductor layer 210, an active layer 220, and a second conductive semiconductor layer 230 may be disposed on a substrate 202. A carrier injection layer 235 may then be disposed on the second conductive semiconductor layer 230. Next, an electrode layer 240 may be disposed on the carrier injection layer 235. The electrode layer 240 may include, for example, an ohmic layer and a reflective layer.

An etching process may then be performed to expose a part of the first conductive semiconductor layer 210. Thereafter, the first electrode 205 may be formed on the first conductive semiconductor layer 210, and a second electrode 215 may be formed on the electrode layer 240. In the embodiment shown in FIG. 4, the second electrode 215 makes contact with the carrier injection layer 235. However, the second electrode 215 is not limited thereto. For example, the second electrode 215 may be electrically connected to the carrier injection layer 235 through the electrode layer 240.

In this embodiment, the carrier injection layer 235 may be disposed between the second conductive semiconductor layer 230 and the electrode layer 240. The work function of the carrier injection layer 235 may be relatively high so that the work function difference between the second conductive semiconductor layer 230 and the carrier injection layer 235 may be relatively large. As the work function difference is relatively large, a potential barrier increases, and hole injection amounts also increase so as to increase the hole injection efficiency when a current is applied. This is realized by increasing the work function of the carrier injection layer 235, which may be done by increasing an oxygen concentration when the carrier injection layer 235 is formed. In this embodiment, the work function of a material used for forming the carrier injection layer 235 may be greater than that of the ohmic layer of the electrode layer 240 or the second conductive semiconductor layer 230.

The carrier injection layer 235 may have a thickness that allows for tunneling, and may function as carrier tunneling layer.

The carrier injection layer 235 may include a transition metal oxide film. For example, a process of forming the carrier injection layer 235 may include a process of forming a metal layer, and a process of irradiating ultraviolet (UV) light onto the metal layer under an oxygen atmosphere for ozone treatment. In alternative embodiments, a process of forming the carrier injection layer 235 may include a process of forming a metal layer, and heat-treating the metal layer under an oxygen atmosphere using a rapid thermal process.

In the embodiment shown in FIG. 4, the second electrode 215 may be in contact with a part of the carrier injection layer 235. However, the second electrode 215 is not limited thereto. For example, if the second electrode 215 is in direct contact with a region of the carrier injection layer 235, according to the relationship between the work function of the carrier injection layer 235 and the work function of a contact surface with the light emitting structure, the resistance of the direct contact region increases. The increased resistance hinders a vertical current flowing from the second electrode 215 along the light emitting structure. Since a vertical current is hindered by the increased resistance, the current may be diffused along the carrier injection layer 235.

In the LED 200 shown in FIG. 4, the carrier injection layer 235 increases the work function difference between the second conductive semiconductor layer 230 and the electrode layer 240, so as to increase hole injection efficiency and current injection efficiency, thereby improving the overall efficiency of a LED chip.

Figure 5:
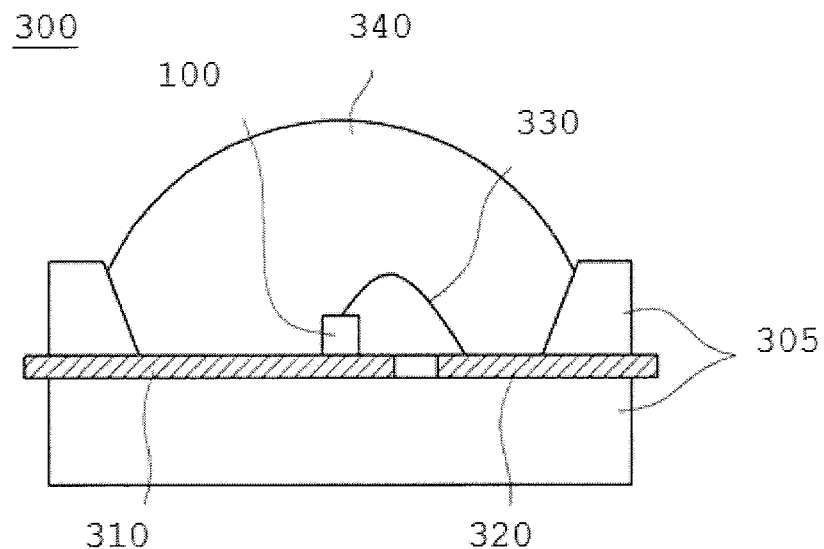
FIG. 5 is a sectional view of an LED package according to an embodiment as broadly described herein.

FIG. 5 is a sectional view of an LED package 300 including an LED as embodied and broadly described herein.

Referring to FIG. 5, the LED package 300 may include a body 305, a first package electrode layer 310 and a second package electrode layer 320 disposed in the body 305, an LED 100 disposed in the body 305 and electrically connected to the first package electrode layer 310 and the second package electrode layer 320, and a molding member 340 surrounding the LED 100.

The body 305 may be formed of a silicon material, a synthetic resin material, a metal material, or other material as appropriate. An inclined surface may be disposed around the LED 100.

The first package electrode layer 310 and the second package electrode layer 320 may be electrically separated from each other and supply a power to the LED 100. The first package electrode layer 310 and the second package electrode layer 320 may also reflect light generated by the LED 100 to improve light efficiency, and may release heat generated by the LED 100 to the outside.

The vertical type LED 100 illustrated in FIG. 3 may be employed in the LED package 300 shown in FIG. 5, but is not limited thereto. For example, the lateral type LED 200 illustrated in FIG. 4 may instead be employed in the LED package 300.

The LED 100 may be disposed on the body 305, or on the first package electrode layer 310, or the second package electrode layer 320. The LED 100 may be electrically connected to the first package electrode layer 310 and/or the second package electrode layer 320 by a wire 330. The molding member 340 may surround the LED 100 so as to protect the LED 100. A phosphor may be contained in the molding member 340 so as to vary a wavelength of light emitted by the LED 100.

Figure 6:
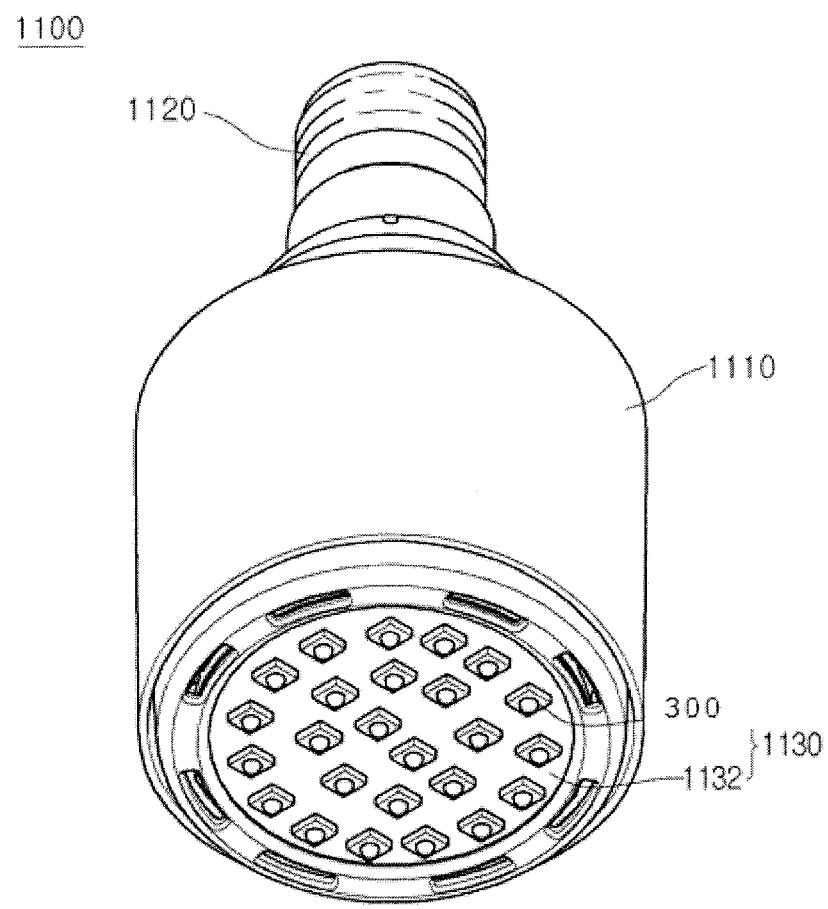
FIG. 6 is a perspective view of a lighting unit according to an embodiment as broadly described herein.
Figure 7:
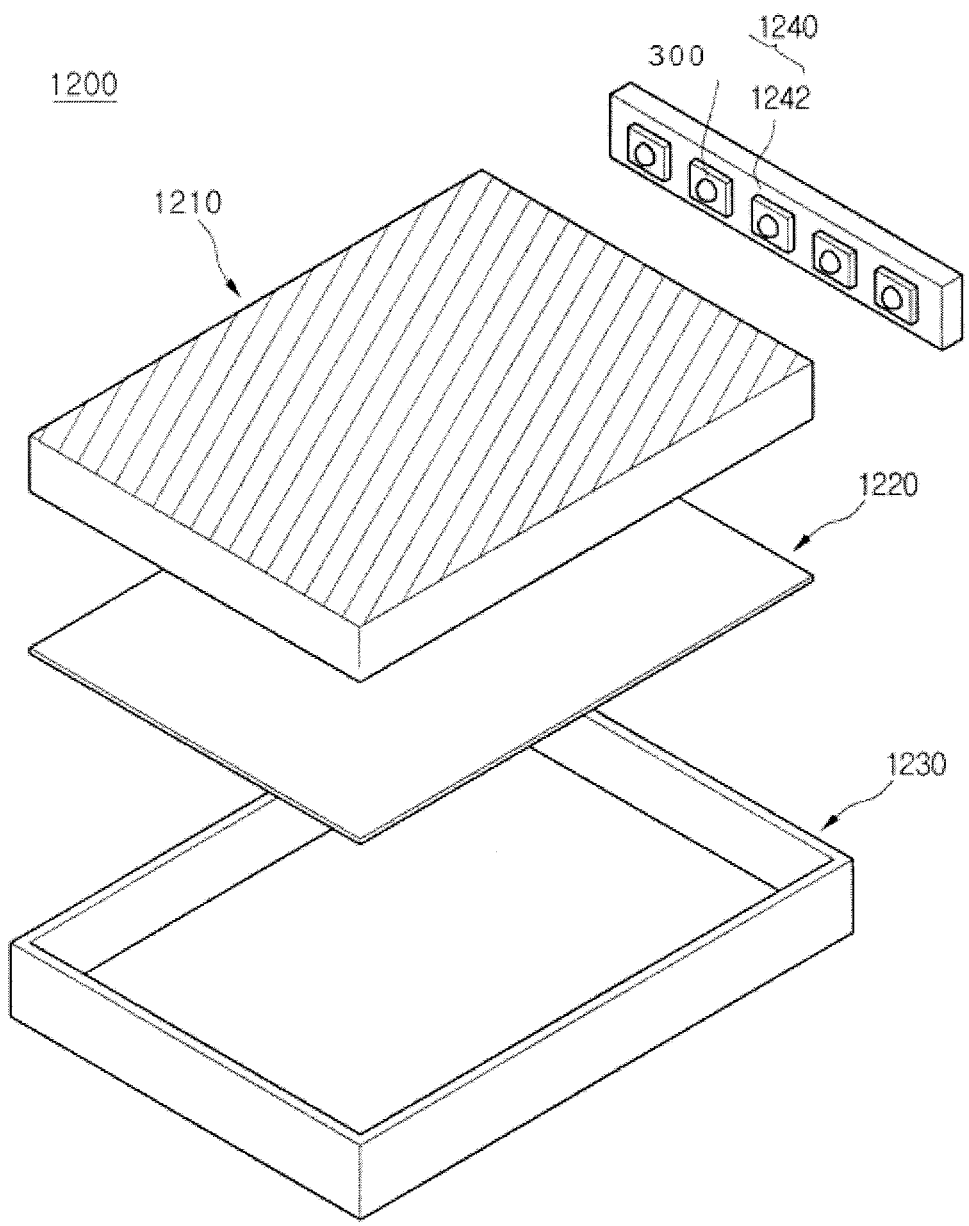
FIG. 7 is an exploded perspective view of a backlight unit according to an embodiment as broadly described herein.

An LED package as embodied and broadly described herein may be applicable to a lighting system. Such lighting systems may include, for example, a lighting unit 1100 as shown in FIG. 6, and a backlight unit 1200 as shown in FIG. 7. Such lighting systems may include, for example, traffic lights, vehicle headlights, signs, and numerous other types of lighting systems.

The lighting unit 1100 shown in FIG. 6 may include a case body 1110, a light emitting module 1130 disposed in the case body 1110, and a connection terminal 1120 disposed in the case body 1110 so as to receive power from an external power source.

The case body 1110 may be formed of a material having appropriate heat dissipation characteristics. For example, the case body 1110 may be formed of a metal material, a resin material, or other material as appropriate.

The light emitting module 1130 may include a substrate 1132 and at least one light emitting device package 300 mounted on the substrate 1132. The substrate 132 may include a circuit pattern printed on an insulation material. The substrate 1132 may be, for example, a printed circuit board (PCB), a metal core PCB, a flexible PCB, a ceramic PCB, or other substrate as appropriate. The substrate 1132 may also be formed of a material that effectively reflects light. For example, a surface of the substrate 1132 may be coated with a colored material, such as, for example, a white or silver-colored material, by which light is effectively reflected.

The at least one light emitting device package 300 may be mounted on the substrate 1132. The light emitting device package 300 may include at least one light emitting diode 100. The light emitting diode 100 may include a colored light emitting diode that emits red, green, blue, or white light and a UV light emitting diode that emits ultraviolet (UV) light.

In certain embodiments, the light emitting module 1130 may include a plurality of light emitting device packages 300 to obtain various colors and brightness. For example, a white LED, a red LED, and a green LED may be disposed in combination with each other to secure a high color rendering index (CRI).

The connection terminal 1120 may be electrically connected to the light emitting module 1130 to supply power. In the embodiment shown in FIG. 6, the connection terminal 1120 is screwed into an external power source in a socket manner. However, the present disclosure is not limited thereto. For example, the connection terminal 1120 may have a pin shape that is inserted into the external power source or connected to the external power using an interconnection. Other arrangements may also be appropriate.

The backlight unit 1200 shown in FIG. 7 may include a light guide plate 1210, a light emitting module 1240, a reflective member 1220, and a bottom cover 1230. Other arrangements may also be appropriate. The light emitting module 1240 may provide light to the light guide plate 1210. The reflective member 1220 may be disposed below the light guide plate 1210. The bottom cover 1230 may receive the light guide plate 1210, the light emitting module 1240, and the reflective member 1220 therein.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, a polyethylene naphthalate (PEN) resin, or other material as appropriate.

The light emitting module 1240 provides light to at least one surface of the light guide plate 1210. Thus, the light emitting module 1240 may be used as a light source of a display device including this type of backlight unit 1200.

The light emitting module 1240 may contact the light guide plate 1210, but is not limited thereto. In particular, the light emitting module 1240 may include a substrate 1242 and a plurality of light emitting device packages 300 mounted on the substrate 1242. The substrate 1242 may contact the light guide plate 1210, or may be spaced apart from the light guide plate 1210, depending on a particular arrangement of components.

The substrate 1242 may be, for example, a PCB including a circuit pattern, a metal core PCB, a flexible PCB, or other type of substrate as appropriate.

A light emitting surface of each of the plurality of light emitting device packages 300 may be spaced apart a predetermined distance from the light guide plate 1210.

The reflective member 1220 may be disposed below the light guide plate 1210 to reflect light incident onto a bottom surface of the light guide plate 1210 in an upward direction, thereby improving brightness of the backlight unit 1200. For example, the reflective member 1220 may be formed of one of PET, PC, PVC, or other material as appropriate.

The bottom cover 1230 may receive the light guide plate 1210, the light emitting module 1240, and the reflective member 1220 therein. Thus, the bottom cover 1230 may have a box shape with an opened upper side, or other configuration as appropriate.

The bottom cover 1230 may be formed of a metal material or a resin material, and may be manufactured using a press forming process or an extrusion molding process. Other materials and processes may also be appropriate.

Embodiments provide a light emitting device (LED), an LED package, and a lighting system that have improved current injection efficiency and emission efficiency.

In one embodiment, a light emitting device (LED) may include a light emitting structure comprising a first conductive semiconductor layer, an active layer, a second conductive semiconductor layer; a carrier injection layer over the light emitting structure; and a second electrode layer over the carrier injection layer.

In another embodiment, an LED package as embodied and broadly described herein may include an LED, including a light emitting structure, a carrier injection layer over the light emitting structure, and a second electrode layer over the carrier injection layer; and a package body in which the LED is disposed.

In another embodiment, a lighting system as embodied and broadly described herein may include an LED package, including an LED comprising a light emitting structure, a carrier injection layer over the light emitting structure, and a second electrode layer over the carrier injection layer; and a package body in which the LED is disposed.

Any reference in this specification to "one embodiment," "an embodiment," "example embodiment," etc., means that a particular feature, structure, or characteristic described in connection with the embodiment is included in at least one embodiment as broadly described herein. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device (LED), comprising:
   a light emitting structure comprising a first conductive semiconductor layer, an active layer, and a second conductive semiconductor layer;
   a carrier injection layer over the second conductive semiconductor layer;
   an electrode layer over the carrier injection layer;
   a first electrode coupled to the first semiconductor layer; and
   a second electrode over the electrode layer, wherein the second electrode passes through the electrode layer to establish electrical coupling to the carrier injection layer and wherein the second electrode physically contacts the carrier injection layer without physically contacting the second conductive semiconductor layer,
   wherein a portion of the electrode layer includes a reflection layer,
   wherein the second electrode passes through the reflection layer, and a lateral width of a bottom surface of the second electrode is less than a lateral width of a top surface of the second electrode,
   wherein the carrier injection layer directly contacts with the second electrode and the electrode layer, and a work function of a material used for forming the carrier injection layer is greater than that of the electrode layer and the second conductive semiconductor layer,
   wherein the carrier injection layer is one single layer, and
   wherein both top edge surfaces of the second conductive semiconductor layer are exposed from both edges of the carrier injection layer, a width of the carrier injection layer and a width of the electrode layer being the same.

2. The LED of claim 1, wherein the carrier injection layer includes a transition metal oxide layer and wherein the transition metal oxide layer comprises a hole injection layer.

3. The LED of claim 1, wherein the carrier injection layer is or includes a carrier tunneling layer.

4. The LED of claim 3, wherein the carrier injection layer has a thickness of about 1 nm to about 30 nm.

5. The LED of claim 1, wherein the carrier injection layer includes a transition metal oxide layer and wherein the transition metal oxide includes at least one of aluminum (Al), magnesium (Mg), cadmium (Cd), tin (Sn), lead (Pb), copper (Cu), silver (Ag), gold (Au), tungsten (W), rhenium (Re), cobalt (Co), chromium (Cr), nickel (Ni), ruthenium (Ru), rhodium (Rh), palladium (Pd), platinum (Pt), or germanium (Ge).

6. The LED of claim 1, wherein the second conductive semiconductor layer is a p-type semiconductor layer or an n-type semiconductor layer.

7. An LED package including the LED of claim 1, comprising a package body which includes the LED.

8. A lighting system comprising a light emitting module comprising the LED package of claim 7.

9. The LED of claim 1, wherein the second electrode is in direct contact with a part of the carrier injection layer to establish said electrical coupling, and wherein said part of the carrier injection layer is disposed under the second electrode, wherein the second electrode physically contacts the reflection layer.

10. The LED of claim 1, wherein the second electrode is physically in contact with a part of the carrier injection layer.

11. The LED of claim 1, wherein the second electrode vertically overlaps with the reflection layer.

12. The LED of claim 1, wherein a thickness of the carrier injection layer is less than a thickness of the electrode layer.

13. The LED of claim 2, wherein the work function of the transition metal oxide layer is greater than 4.2 ev.

14. The light emitting device of claim 13, wherein the work function of the second conductive semiconductor layer is 4.0 ev, and the work function of the ohmic layer is 4.2 ev when the ohmic layer is or includes an indium tin oxide (ITO) layer.

15. The light emitting device of claim 1, wherein the work function of the material used for forming the carrier injection layer is greater when formed on the light emitting device than prior to being formed on the light emitting device.

16. A light emitting device (LED), comprising:
a light emitting structure comprising a first conductive semiconductor layer, an active layer, and a second conductive semiconductor layer;
a transition metal oxide layer over the second conductive semiconductor layer;
an ohmic layer and a reflection layer over the transition metal oxide layer;
a first electrode coupled to the first conductive semiconductor layer; and
a second electrode over the ohmic layer, wherein the second electrode extends through the ohmic layer and the reflection layer to establish electrical coupling to the transition metal oxide layer, wherein the transition metal oxide layer has a work function greater than the ohmic layer, and wherein the second electrode physically contacts the transition metal oxide layer without physically contacting the second conductive semiconductor layer,
wherein a portion of the ohmic layer vertically overlaps with the reflection layer,
wherein the second electrode passes through the reflection layer, and a lateral width of a bottom surface of the second electrode is less than a lateral width of a top surface of the second electrode, and
wherein the transition metal layer directly contacts with the second electrode and the ohmic layer, and a work function of a material used for forming the transition metal layer is greater than that of the ohmic layer and the second conductive semiconductor layer,
wherein the transition metal layer is one single layer, and
wherein both top edge surfaces of the second conductive semiconductor layer are exposed from both edges of the transition metal layer, a width of the transition metal layer and widths of the ohmic layer and the reflection layer being the same.

17. The light emitting device of claim 16, wherein the work function of the transition metal oxide layer is greater than 4.2 ev when the ohmic layer is or includes an indium tin oxide (ITO) layer.

18. The LED of claim 16, wherein the second electrode is in direct contact with part of the transition metal oxide layer, and wherein said part of the transition metal oxide layer is disposed under the second electrode.

19. The LED of claim 16, wherein the second electrode vertically overlaps with the reflection layer.

20. The LED of claim 16, wherein a thickness of the transition metal oxide layer is less than a thickness of the ohmic layer.

21. The light emitting device of claim 16, wherein the work function of the ohmic layer is greater than the work function of the second conductive semiconductor layer.

22. The light emitting device of claim 16, wherein the work function of the material used for forming the transition metal layer is greater when formed on the light emitting device than prior to being formed on the light emitting device.

* * * * *